US009951883B2

United States Patent
Seo et al.

(10) Patent No.: US 9,951,883 B2
(45) Date of Patent: Apr. 24, 2018

(54) APPARATUS AND METHOD OF MEASURING COIL CURRENT OF HYDRAULIC VALVE

(71) Applicant: MANDO CORPORATION, Pyeongtaek-si (KR)

(72) Inventors: Jung-Wook Seo, Osan-si (KR); Kwan-Seek Kim, Hwaseong-si (KR); Chang-Woo Lee, Seongnam-si (KR)

(73) Assignee: MANDO CORPORATION, Gyeonggi-Do (KR)

( * ) Notice: Subject to any disclaimer, the term of this patent is extended or adjusted under 35 U.S.C. 154(b) by 42 days.

(21) Appl. No.: 14/719,005

(22) Filed: May 21, 2015

(65) Prior Publication Data

US 2015/0337984 A1    Nov. 26, 2015

(30) Foreign Application Priority Data

May 22, 2014 (KR) .................... 10-2014-0061305

(51) Int. Cl.
*F16K 37/00* (2006.01)
*G01R 19/00* (2006.01)
(Continued)

(52) U.S. Cl.
CPC ...... *F16K 37/0083* (2013.01); *G01R 19/0092* (2013.01); *H03K 17/64* (2013.01); *F02D 41/20* (2013.01); *F02D 2041/2058* (2013.01)

(58) Field of Classification Search
None
See application file for complete search history.

(56) References Cited

U.S. PATENT DOCUMENTS 4,238,813 A * 12/1980 Carp .................... F02D 41/20
123/490
4,967,309 A * 10/1990 Hoffman .............. H01H 47/325
318/432
(Continued)

FOREIGN PATENT DOCUMENTS

CN          1701237        11/2005
CN          102189984       9/2011
(Continued)

OTHER PUBLICATIONS

Office Action dated Jun. 7, 2017 for Chinese Patent Application No. 201510266921.7 and its English translation from Global Dossier.

*Primary Examiner* — Jermele M Hollington
*Assistant Examiner* — Douglas X Rodriguez
(74) *Attorney, Agent, or Firm* — Ladas & Parry, LLP

(57) ABSTRACT

Disclosed herein are an apparatus and method of measuring a coil current of a hydraulic valve. The apparatus includes a first coil current measurement unit configured to receive a first coil current control signal from a coil current control device during an ON operating section of the hydraulic valve in operating sections of the hydraulic valve operated by receiving power of a battery, and measure a first coil current value flowing through a coil of the hydraulic valve using a first switching element to be switched ON, and a second coil current measurement unit configured to receive a second coil current control signal from the coil current control device during an OFF operating section of the hydraulic valve in the operating sections of the hydraulic valve operated by receiving power of the battery, and measure a second coil current value flowing through the coil of the hydraulic valve using a second switching element to be switched ON.

16 Claims, 13 Drawing Sheets

(51) Int. Cl.
*H03K 17/64* (2006.01)
*F02D 41/20* (2006.01)

(56) References Cited

U.S. PATENT DOCUMENTS

| | | |
|---|---|---|
| 5,442,515 A | 8/1995 | Wallaert |
| 2004/0078132 A1* | 4/2004 | Fey .......................... B60T 8/36 701/70 |
| 2015/0303805 A1* | 10/2015 | Franchini ................ B60T 8/885 323/271 |

FOREIGN PATENT DOCUMENTS

| | | |
|---|---|---|
| CN | 102272435 | 12/2011 |
| CN | 102829240 | 12/2012 |
| DE | 10 2006 041 193 | 3/2008 |

\* cited by examiner

APPARATUS AND METHOD OF MEASURING COIL CURRENT OF HYDRAULIC VALVE

CROSS-REFERENCE TO RELATED APPLICATION

This application claims the benefit of Korean Patent Application No. 10-2014-0061305, filed on May 22, 2014 in the Korean Intellectual Property Office, the disclosure of which is incorporated in its entirety herein by reference.

BACKGROUND

1. Field

Embodiments of the present invention relate to an apparatus and method of measuring a coil current of a hydraulic valve.

2. Description of the Related Art

In general, an apparatus for measuring a coil current of a hydraulic valve of the related art is provided to measure the coil current provided to the hydraulic valve.

Here, it is difficult for the apparatus for measuring the coil current of the hydraulic valve of the related art to efficiently measure the coil current during an OFF operating section of the hydraulic valve or an ON operating section of the hydraulic valve.

Since it is difficult for the apparatus for measuring the coil current of the hydraulic valve of the related art to measure the coil current in consideration of cost of parts consumed to measure the coil current upon measurement of the coil current, the coil current cannot be efficiently measured while suppressing an increase in cost of parts.

In addition, it is difficult for the apparatus for measuring the coil current of the hydraulic valve of the related art to precisely control the coil current of the hydraulic valve.

Accordingly, in recent times, researches on an apparatus and a method of measuring a coil current of a hydraulic valve that are capable of efficiently measuring the coil current and precisely controlling the coil current of the hydraulic valve while suppressing an increase in cost of parts upon measurement of the coil current are being continuously performed.

In addition, in recent times, researches on an apparatus and a method of measuring a coil current of a hydraulic valve that are capable of improving convenience of an operation when the coil current is measured are continuously performed.

SUMMARY

Therefore, it is an aspect of the present invention to provide an apparatus and a method of measuring a coil current of a hydraulic valve that are capable of efficiently measuring the coil current while suppressing an increase in cost of parts.

In addition, it is another aspect of the present invention to provide an apparatus and a method of measuring a coil current of a hydraulic valve that are capable of precisely controlling the coil current of the hydraulic valve.

Further, it is still another aspect of the present invention to provide an apparatus and a method of measuring a coil current of a hydraulic valve that are capable of improving convenience of an operation because an operator can recognize a measurement circumstance of the coil current.

Additional aspects of the invention will be set forth in part in the description which follows and, in part, will be obvious from the description, or may be learned by practice of the invention.

In accordance with one aspect of the present invention, an apparatus for measuring a coil current of a hydraulic valve includes a first coil current measurement unit configured to measure a first coil current value flowing through a coil of the hydraulic valve using a first switching element to be switched ON by receiving a first coil current control signal from a coil current control device during an ON operating section of the hydraulic valve in operating sections of the hydraulic valve operated by receiving power of a battery; and a second coil current measurement unit configured to receive a second coil current control signal from the coil current control device during an OFF operating section of the hydraulic valve in the operating sections of the hydraulic valve operated by receiving power of the battery, and measure a second coil current value flowing through the coil of the hydraulic valve using a second switching element to be switched ON.

Here, first coil current measurement unit may include a first switching element electrically connected to the coil current control device and the coil and the second coil current measurement unit and grounded, and configured to receive the first coil current control signal to be switched ON; and a first coil current feedback unit electrically connected to the coil current control device, the first switching element, the coil, and the second coil current measurement unit.

In addition, the first coil current measurement unit may further include a clamp diode electrically connected to the coil current control device, the first switching element and the first coil current feedback unit.

In addition, the second coil current measurement unit may include a second switching element electrically connected to the coil current control device and the battery and the coil and configured to receive the second coil current control signal to be switched ON; and a second coil current feedback unit electrically connected to the coil current control device, the second switching element, the battery and the coil.

In addition, the second coil current measurement unit may further include an inverter electrically connected to the coil current control device and the second switching element.

In addition, the coil current control device may further correct the measured first coil current value or the measured second coil current value to match a preset first target coil current value or a preset second target coil current value, and provide the corrected first target coil current value or the corrected second target coil current value to the coil of the hydraulic valve.

In addition, the coil current control device may further include a multiplexer (MUX) configured to receive an analog signal of the measured first coil current value or the measured second coil current value; an analog digital converter (ADC) configured to convert a first coil current value or a second coil current value of the supplied analog signal into a digital signal; a target coil current setting unit configured to set a digital signal of the first target coil current value or the second target coil current value; a proportional integral (PII) controller configured to receive the first coil current value or the second coil current value converted into the digital signal, and the first target coil current value or the second target coil current value of the digital signal, and calculate a first target coil current value or a second target coil current value of a digital signal to be corrected; and a pulse width modulation (PWM) generator configured to provide the first coil current control signal to the first coil current measurement unit or provide the second coil current control signal to the second coil current measurement unit, and generate a target coil current pulse corresponding to the first target coil current value or the second target coil current value of the corrected digital signal to correct the coil current flowing through the coil of the hydraulic valve to provide the target coil current pulse to the coil of the hydraulic valve.

In addition, the apparatus may further include a first identification unit configured to identify a circumstance in which the coil current flowing through the coil of the hydraulic valve during an ON operating section of the hydraulic valve is measured when the first coil current value is measured.

In addition, the apparatus may further include a second identification unit configured to identify a circumstance in which the coil current flowing through the coil of the hydraulic valve during an OFF operating section of the hydraulic valve is measured when the second coil current value is measured.

According to another aspect of the present invention, a method of measuring a coil current of a hydraulic valve includes a first coil current measurement step of receiving a first coil current control signal from a coil current control device during an ON operating section of the hydraulic valve in operating sections of the hydraulic valve operated by receiving power of a battery, and measuring a first coil current value flowing through a coil of the hydraulic valve using a first switching element to be switched ON; and a second coil current measurement step of receiving a second coil current control signal from the coil current control device during an OFF operating section of the hydraulic valve in the operating sections of the hydraulic valve operated by receiving power of the battery, and measuring a second coil current value flowing through the coil of the hydraulic valve using a second switching element to be switched ON.

Here, the method may further include a coil current correction step of correcting the measured first coil current value or the measured second coil current value to match a preset first target coil current value or a preset second target coil current value, and providing the corrected first target coil current value or the corrected second target coil current value to the coil of the hydraulic valve.

In addition, the method may further include a first identification step of identifying a circumstance in which the coil current flowing through the coil of the hydraulic valve during the ON operating section of the hydraulic valve is measured when the first coil current value is measured.

In addition, the method may further include a second identification step of identifying a circumstance in which the coil current flowing through the coil of the hydraulic valve during the OFF operating section of the hydraulic valve is measured when the second coil current value is measured.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
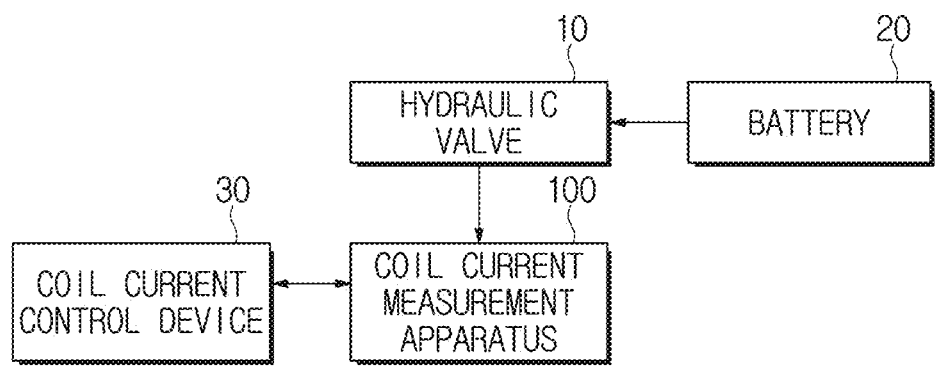
FIG. 1 is a block diagram showing a state in which an apparatus for measuring a coil current of a hydraulic valve according to a first embodiment of the present invention is connected to a coil current control device, a hydraulic valve, and a battery.

Reference will now be made in detail to the embodiments of the present invention, examples of which are illustrated in the accompanying drawings, wherein like reference numerals refer to like elements throughout. In the drawings, parts not relating to the description are omitted from the drawings and sizes of components may be exaggerated for clarity.

Figure 2:
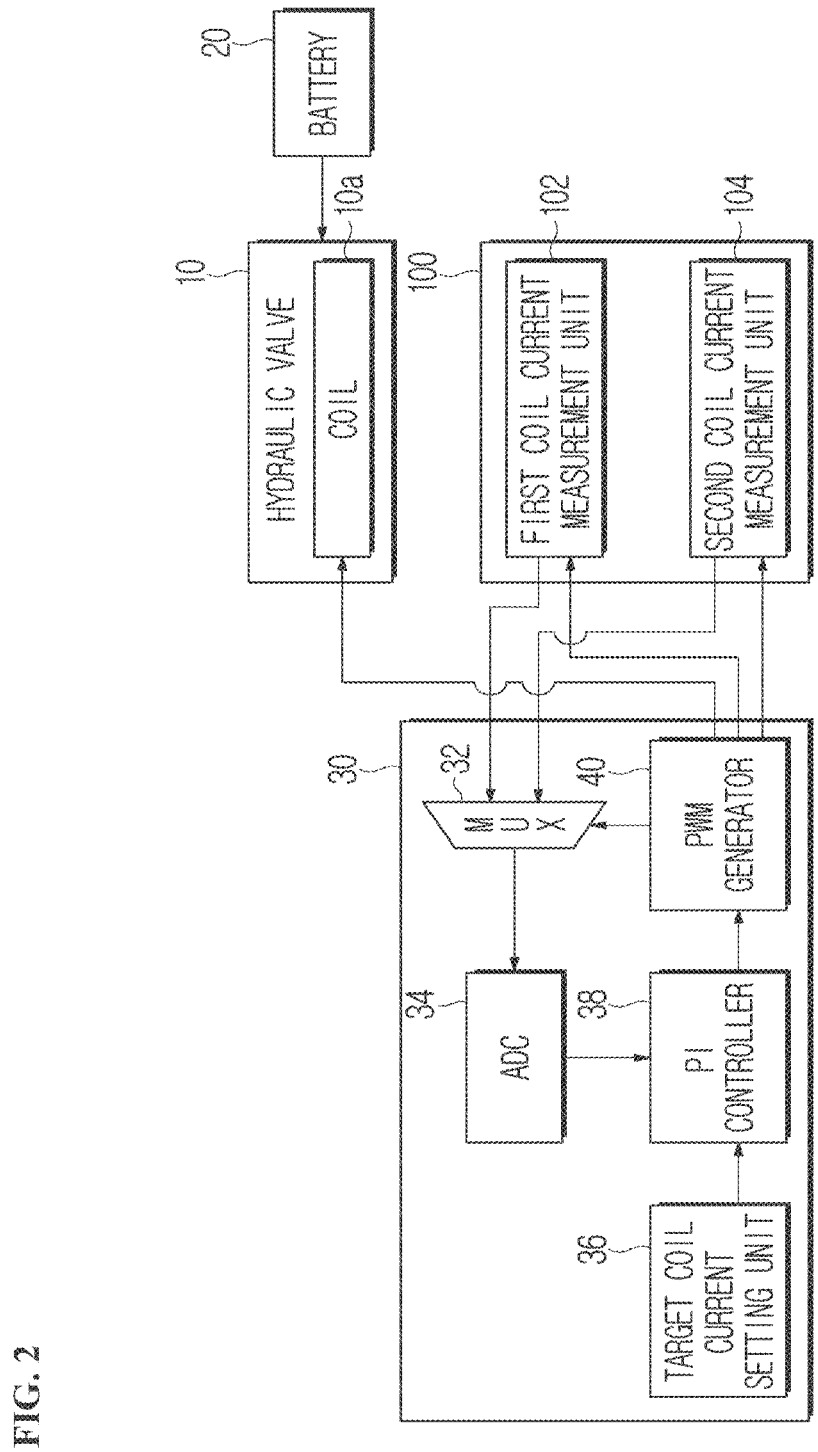
FIG. 2 is a block diagram showing an example of the coil current control device and the coil current measurement apparatus shown in FIG. 1.

FIG. 1 is a block diagram showing a state in which an apparatus for measuring coil current of a hydraulic valve according to a first embodiment of the present invention is connected to a coil current control device, a hydraulic valve, and a battery, and FIG. 2 is a block diagram showing an example of the coil current control device and the coil current measurement apparatus shown in FIG. 1.

Figure 3:
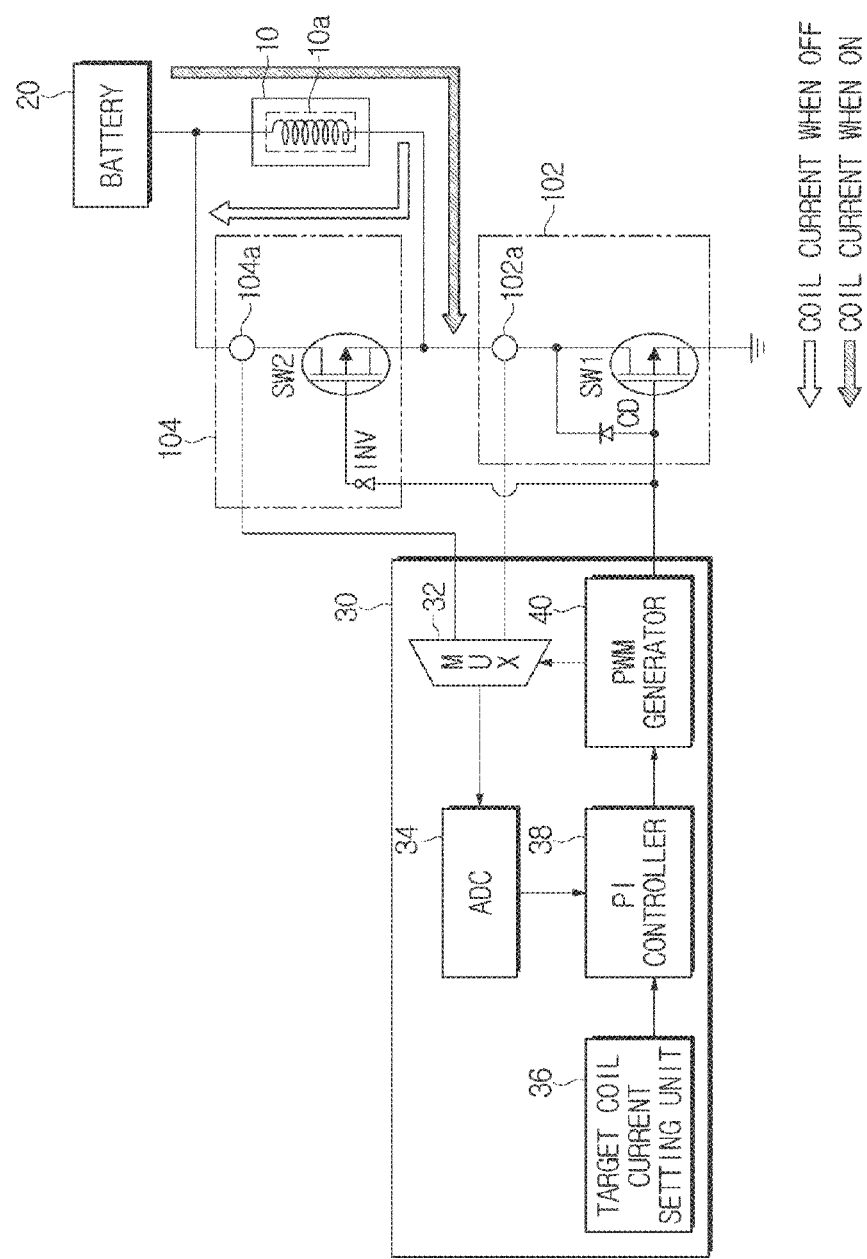
FIG. 3 is a circuit diagram showing an example of the hydraulic valve, the coil current measurement apparatus, and the coil current control device shown in FIG. 2.

FIG. 3 is a circuit diagram showing an example of the hydraulic valve, the coil current measurement apparatus, and the coil current control device shown in FIG. 2.

Referring to FIGS. 1 to 3, an apparatus 100 for measuring a coil current of a hydraulic valve 10 according to the first embodiment of the present invention includes a first coil current measurement unit 102 and a second coil current measurement unit 104.

The first coil current measurement unit 102 measures a first coil current value flowing through a coil 10a of the hydraulic valve 10 using a first switching element SW1 to be switched ON by receiving a first coil current control signal from a coil current control device 30 during an ON operating section of the hydraulic valve 10, in operating sections of the hydraulic valve 10 operated by receiving power of a battery 20.

Here, while not shown, the hydraulic valve 10 may be a solenoid valve.

Here, the first coil current measurement unit 102 may include the first switching element SW1 and a first coil current feedback unit 102a, and may further include a clamp diode CD.

The first switching element SW1 is electrically connected to the coil current control device 30, the coil 10a and the second coil current measurement unit 104 and grounded, and can receive a first coil current control signal from the coil current control device 30 to be switched ON.

The first coil current feedback unit 102a is electrically connected to the coil current control device 30, the first switching element SW1, the coil 10a and the second coil current measurement unit 104.

The clamp diode CD may be electrically connected to the coil current control device 30, the first switching element SW1, and the first coil current feedback unit 102a.

For example, in the first switching element SW1, a first end is electrically connected to a pulse-width modulation (PWM) generator 40 of the coil current control device 30 (to be described below), a second end is electrically connected to the other end of the coil 10a and a third end of a second switching element SW2 of the second coil current measurement unit 104, the third end is grounded, and the first switching element SW1 can receive a first coil current control signal generated from the PWM generator 40 of the coil current control device 30 to be switched ON.

Here, the first switching element SW1 may be provided as at least one of a metal-oxide semiconductor field effect transistor (MOSFET), a bipolar junction transistor (BJT), an insulated gate bipolar transistor (IGBT), a gate turn-off (GTO) thyristor, and a MOS controlled thyristor (MCT) such that a switching operating voltage is efficiently supplied upon supply of power to reduce power consumption in consideration of a switching loss rate upon a switching operation.

The first coil current feedback unit 102a may be electrically connected to a first end of a multiplexer (MUX) 32 of the coil current control device 30 and a second end of the first switching element SW1, and may be electrically connected to the other end of the coil 10a and a third end of the second switching element SW2 of the second coil current measurement unit 104.

Here, the first coil current feedback unit 102a may provide a first coil current value measured by a switching-ON operation of the first switching element SW1 to the first end of the MUX 32.

The clamp diode CD may have one end electrically connected to the PWM generator 40 of the coil current control device 30 and the first end of the first switching element SW1, and the other end electrically connected to the second end of the first switching element SW1 and the first coil current feedback unit 102a.

In this way, the first coil current measurement unit 102 receives first coil current control signal supplied from the PWM generator 40 using the first switching element SW1 to be switched ON during the ON operating section of the hydraulic valve 10, and a current path is formed between the first switching element SW1, the battery 20, the hydraulic valve 10, the first coil current feedback unit 102a, and the clamp diode CD to measure a first coil current value flowing through the coil of the hydraulic valve 10.

The second coil current measurement unit 104 measures a second coil current value flowing through the coil 10a of the hydraulic valve 10 using the second switching element SW2 switched ON by receiving the second coil current control signal from the coil current control device 30 during the OFF operating section of the hydraulic valve 10 in the operating sections of the hydraulic valve 10 operated by receiving power from the battery 20.

Here, the second coil current measurement unit 104 may include the second switching element SW2 and a second coil current feedback unit 104a, and may further include an inverter INV.

The second switching element SW2 may be electrically connected to the coil current control device 30, the battery 20, and the coil 10a, and may receive the second coil current control signal from the coil current control device 30 to be switched ON.

The second coil current feedback unit 104a may be electrically connected to the coil current control device 30, the second switching element SW2, the battery 20, and the coil 10a.

The inverter INV may be electrically connected to the coil current control device 30 and the second switching element SW2.

For example, in the second switching element SW2, a first end may be electrically connected to the PWM generator 40 of the coil current control device 30 (to be described below), a second end may be electrically connected to the battery 20 and one end of the coil 10a, and a third end may be electrically connected to the other end of the coil 10a and the first coil current feedback unit 102a of the first coil current measurement unit 102.

Here, the second switching element SW2 may be provided as at least one of a metal-oxide semiconductor field effect transistor (MOSFET), a bipolar junction transistor (BJT), an insulated gate bipolar transistor (IGBT), a gate turn-off (GTO) thyristor, and a MOS controlled thyristor (MCT) such that a switching operating voltage is efficiently supplied upon supply of power to reduce power consumption in consideration of a switching loss rate upon a switching operation.

The second coil current feedback unit 104a may be electrically connected to the second end of the MUX 32 of the coil current control device 30 and the second end of the second switching element SW2, and may be electrically connected to the battery 20 and the one end of the coil 10a.

Here, the second coil current feedback unit 104a may provide a second coil current value measured by a switching-ON operation of the second switching element SW2 to the second end of the MUX 32.

The inverter INV may have one end electrically connected to the PWM generator 40 of the coil current control device 30, one end of the clamp diode CD and the first end of the first switching element SW1, and the other end electrically connected to the first end of the second switching element SW2.

Here, the inverter INV may be a circuit configured to complimentarily drive the first switching element SW1 and the second switching element SW2.

In this way, the second coil current measurement unit 104 receives the second coil current control signal supplied from the PWM generator 40 at the inverter INV during the off operating section of the hydraulic valve 10, the second coil current control signal supplied from the inverter INV is received by the second switching element SW2 to be switched ON, and a current path is between the second switching element SW2, the battery 20, the hydraulic valve 10 and the second coil current feedback unit 104a to measure the second coil current value flowing through the coil of the hydraulic valve 10.

In addition, the coil current control device 30 may correct the first coil current value measured by the first coil current measurement unit 102 or the second coil current value measured by the second coil current measurement unit 104 to match the preset first target coil current value or the preset second target coil current value, and may further provide the corrected first target coil current value or the corrected second target coil current value to the coil 10a of the hydraulic valve 10.

For example, the coil current control device 30 may include the MUX 32, an analog digital converter (ADC) 34, a target coil current setting unit 36, a proportional integral (PI) controller 38, and the PWM generator 40.

The MUX 32 may receive an analog signal of the first coil current value measured by the first coil current feedback unit 102a of the first coil current measurement unit 102 or second coil current value measured by the second coil current feedback unit 104a of the second coil current measurement unit 104.

The ADC 34 can convert the analog signal of the first coil current value or the second coil current value supplied from the MUX 32 into a digital signal.

The target coil current setting unit 36 may be provided to set the digital signal of the first target coil current value or the second target coil current value.

The PI controller 38 may calculate the first coil current value or the second coil current value converted into the digital signal by the ADC 34, and the first target coil current value or the second target coil current value of the digital signal to be corrected by receiving the first target coil current value or the second target coil current value of the digital signal set to the target coil current setting unit 36.

The PWM generator 40 may provide the first coil current control signal to the first switching element SW1 of the first coil current measurement unit 102, or provide the second coil current control signal to the second switching element SW2 of the second coil current measurement unit 104.

In addition, the PWM generator 40 may generate target coil current pulses corresponding to the first target coil current value or the second target coil current value of the digital signal calculated by the PI controller 38 to correct the coil current flowing through the coil 10a of the hydraulic valve 10 during the ON operating section of the hydraulic valve or the OFF operating section of the hydraulic valve, and provide the target coil current pulses to the coil 10a of the hydraulic valve 10 through the clamp diode CD.

Meanwhile, a method of measuring the coil current of the hydraulic valve 10 to measure the coil current of the hydraulic valve 10 using the apparatus 100 for measuring the coil current of the hydraulic valve 10 according to the first embodiment of the present invention will be described with reference to FIGS. 4 and 5.

Figure 4:
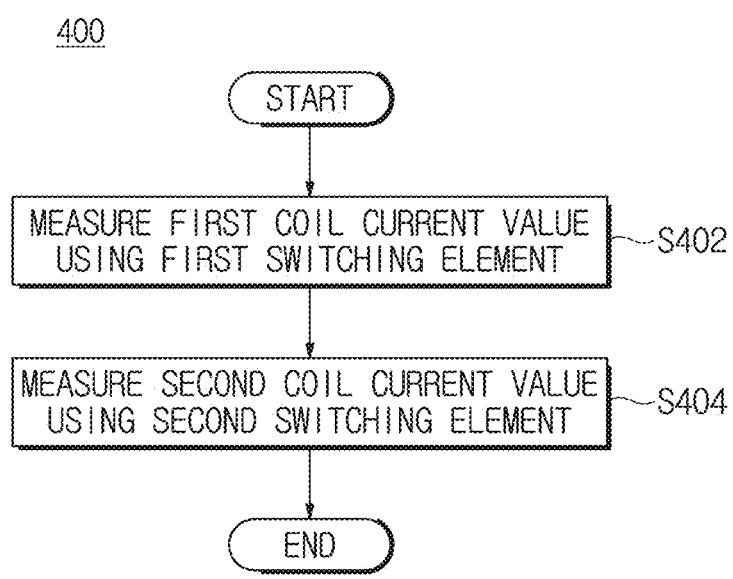
FIG. 4 is a flowchart showing an example of a method of measuring a coil current using the apparatus for measuring the coil current of the hydraulic valve according to the first embodiment of the present invention.
Figure 5:
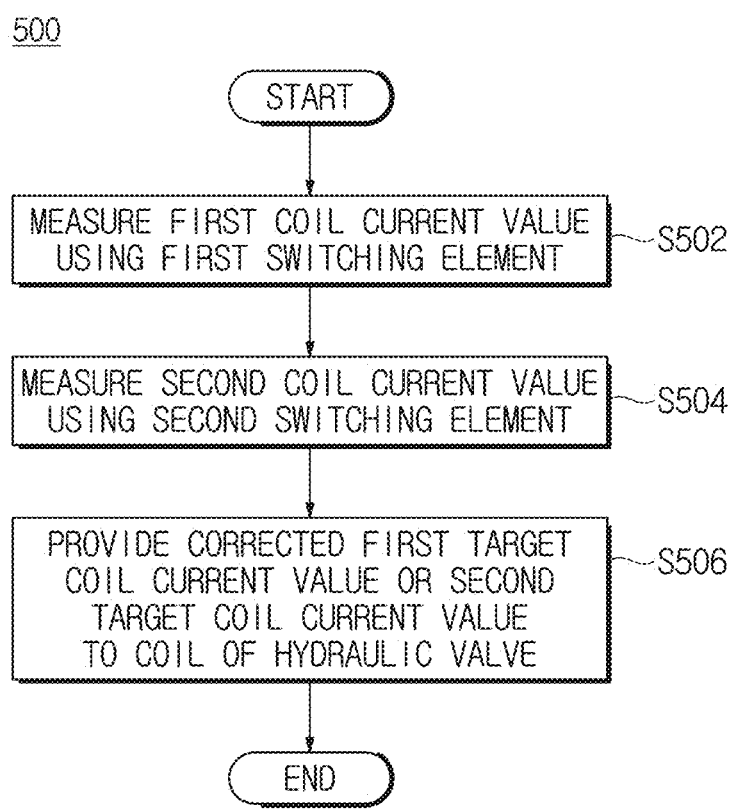
FIG. 5 is a flowchart showing another example of a method of measuring a coil current using the apparatus for measuring the coil current of the hydraulic valve according to the first embodiment of the present invention.

FIG. 4 is a flowchart showing the method of measuring the coil current using the apparatus for measuring the coil current of the hydraulic valve according to the first embodiment of the present invention, and FIG. 5 is a flowchart showing another example of the method of measuring the coil current using the apparatus for measuring the coil current of the hydraulic valve according to the first embodiment of the present invention.

As shown in FIGS. 4 and 5, methods 400 and 500 of measuring the coil current using the apparatus 100 for measuring the coil current of the hydraulic valve 10 according to the first embodiment of the present invention include first coil current measurement steps S402 and S502, second coil current measurement steps S404 and S504, and a coil current correction step S506.

First, in the first coil current measurement steps S402 and S502, the first coil current value flowing through the coil 10a (see FIG. 3) of the hydraulic valve 10 (see FIG. 3) is measured by the first coil current measurement unit 102 (see FIG. 3) using the first switching element SW1 (see FIG. 3) switched ON by receiving the first coil current control signal from the coil current control device 30 (see FIG. 3) during the ON operating section of the hydraulic valve 10 (see FIG. 3) of the operating sections of the hydraulic valve 10 (see FIG. 3) operated by receiving power of the battery 20 (see FIG. 3).

Then, in the second coil current measurement steps S404 and S504, the second coil current value flowing through the coil 10a (see FIG. 3) of the hydraulic valve 10 (see FIG. 3) is measured by the second coil current measurement unit 104 (see FIG. 3) using the second switching element SW2 (see FIG. 3) switched ON by receiving the second coil current control signal from the coil current control device 30 (see FIG. 3) during the OFF operating section of the hydraulic valve 10 (see FIG. 3) of the operating sections of the hydraulic valve 10 (see FIG. 3) operated by receiving power from the battery 20 (see FIG. 3).

Then, in the coil current correction step S506, the first coil current value measured by the first coil current measurement unit 102 (see FIG. 3) or the second coil current value measured by the second coil current measurement unit 104 (see FIG. 3) may be corrected to match the first target coil current value or the second target coil current value preset to the coil current control device 30, and the corrected first target coil current value or the corrected second target coil current value may be provided to the coil 10a of the hydraulic valve 10 from the coil current control device 30.

As described above, the apparatus 100 for measuring the coil current and the coil current measurement methods 400 and 500 of the hydraulic valve 10 according to the first embodiment of the present invention include the first coil current measurement unit 102 and the second coil current measurement unit 104, and perform the first coil current measurement steps S402 and S502, the second coil current measurement steps S404 and S504, and the coil current correction step S506.

Accordingly, in the apparatus 100 for measuring the coil current and the coil current measurement methods 400 and 500 of the hydraulic valve 10 according to the first embodiment of the present invention, since the coil current can be measured in consideration of cost of parts consumed to measure the coil current upon measurement of the coil current, the coil current can be efficiently measured while suppressing an increase in cost of parts.

Figure 6:
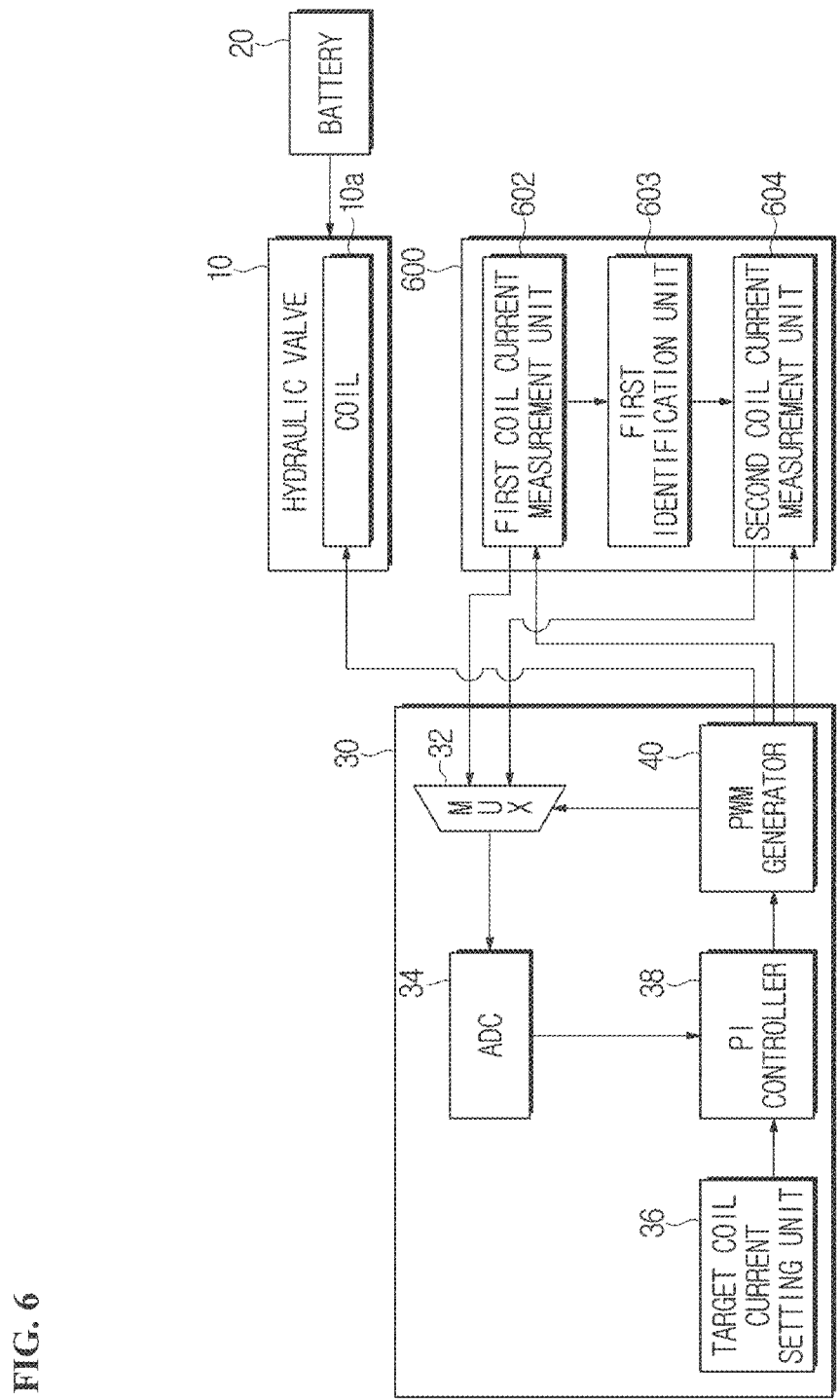
FIG. 6 is a block diagram showing an example of an apparatus for measuring a coil current of a hydraulic valve and a coil current control device according to a second embodiment of the present invention.
Figure 7:
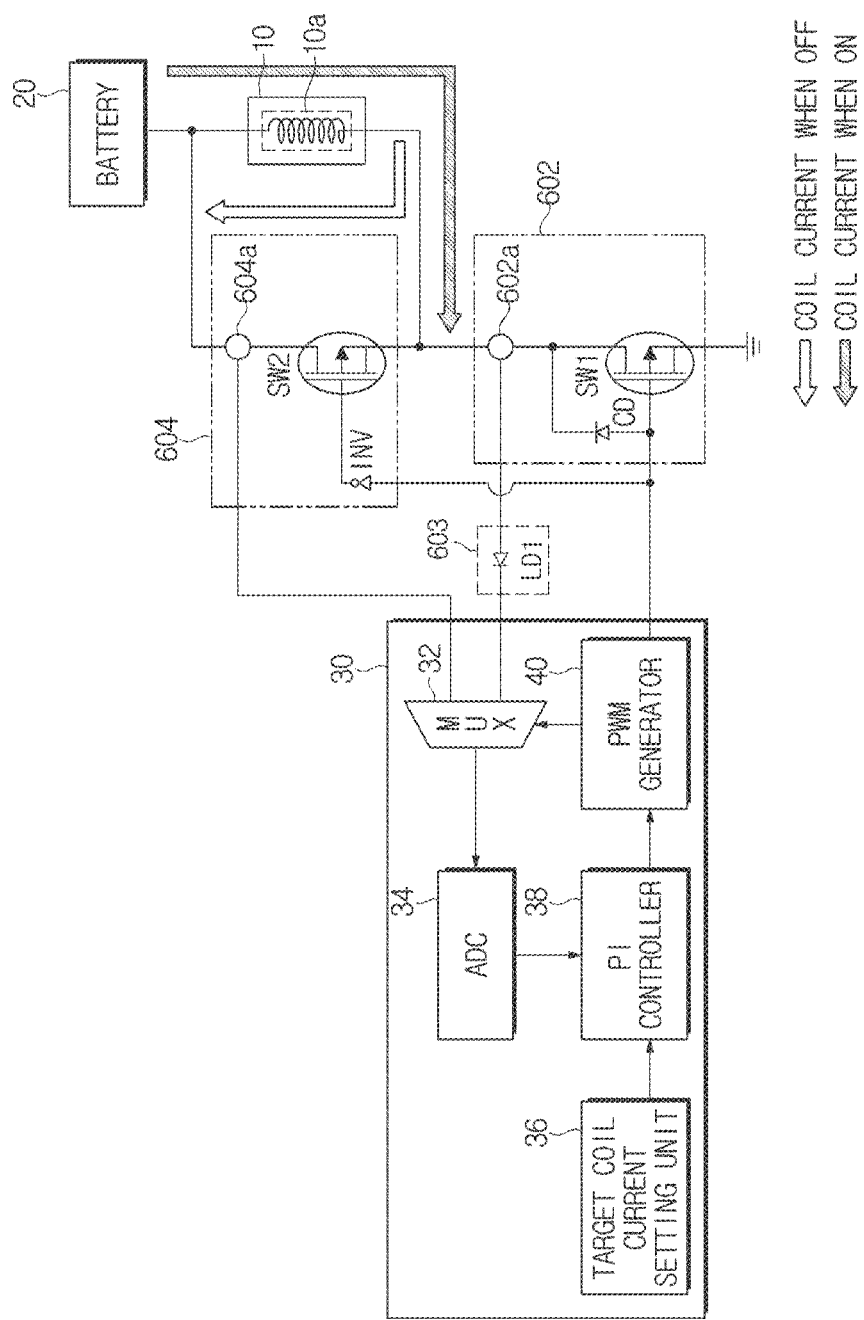
FIG. 7 is a circuit diagram showing an example of the hydraulic valve, the coil current measurement apparatus, and the coil current control device shown in FIG. 6.

In addition, in the apparatus 100 for measuring the coil current and the coil current measurement methods 400 and 500 of the hydraulic valve 10 according to the first embodiment of the present invention, since the corrected first target coil current value or the corrected second target coil current value can be provided to the coil 10a of the hydraulic valve 10, the coil current of the hydraulic valve 10 can be precisely controlled FIG. 6 is a block diagram showing an example of an apparatus for measuring a coil current of a hydraulic valve and a coil current control device according to a second embodiment of the present invention, and FIG. 7 is a circuit diagram showing an example of the hydraulic valve, the coil current measurement apparatus and the coil current control device shown in FIG. 7.

Referring to FIGS. 6 and 7, a apparatus 600 for measuring the coil current of a hydraulic valve 10 according to the second embodiment of the present invention includes a first coil current measurement unit 602 and a second coil current measurement unit 604, like the apparatus 100 for measuring the coil current (see FIGS. 2 and 3) of the hydraulic valve 10 (see FIGS. 2 and 3) according to the first embodiment.

In this way, since functions of the first coil current measurement unit 602 and the second coil current measurement unit 604 corresponding to the apparatus 600 for measuring the coil current of the hydraulic valve 10 according to the second embodiment of the present invention and an organic connection relation therebetween are the same as functions of the first coil current measurement unit 102 (see FIGS. 2 and 3) and the second coil current measurement unit 104 (see FIGS. 2 and 3) corresponding to the apparatus 100 for measuring the coil current (see FIGS. 2 and 3) of the hydraulic valve 10 (see FIGS. 2 and 3) according to the first embodiment and an organic connection relation therebetween, additional description thereof will be omitted.

Here, the apparatus 600 for measuring the coil current of the hydraulic valve 10 according to the second embodiment of the present invention may further include a first identification unit 603.

That is, the first identification unit 603 identifies a circumstance in which the coil current flowing through the coil 10a of the hydraulic valve 10 during the ON operating section of the hydraulic valve 10 when the first coil current value is measured by the first coil current measurement unit 602.

For example, the first identification unit 603 can recognize the circumstance in which the coil current flowing through the coil 10a of the hydraulic valve 10 during the ON operating section of the hydraulic valve 10 when the first coil current value is measured by the first coil current measurement unit 602 using a first light emitting diode LD1.

Here, the first light emitting diode LD1 may be electrically connected to the first coil current measurement unit 602 and the coil current control device 30 to identify a measurement circumstance of the coil current through a light emission operation.

For example, the first light emitting diode LD1 may be electrically connected to a first coil current feedback unit 602a of the first coil current measurement unit 602 and a first end of the MUX 32 of the coil current control device 30 to the measurement circumstance of the coil current through the light emission operation.

Hereinafter, the coil current measurement method of the hydraulic valve 10 for measuring the coil current of the hydraulic valve 10 using the apparatus 600 for measuring the coil current of the hydraulic valve 10 according to the second embodiment of the present invention will be described with reference to FIGS. 8 and 9.

Figure 8:
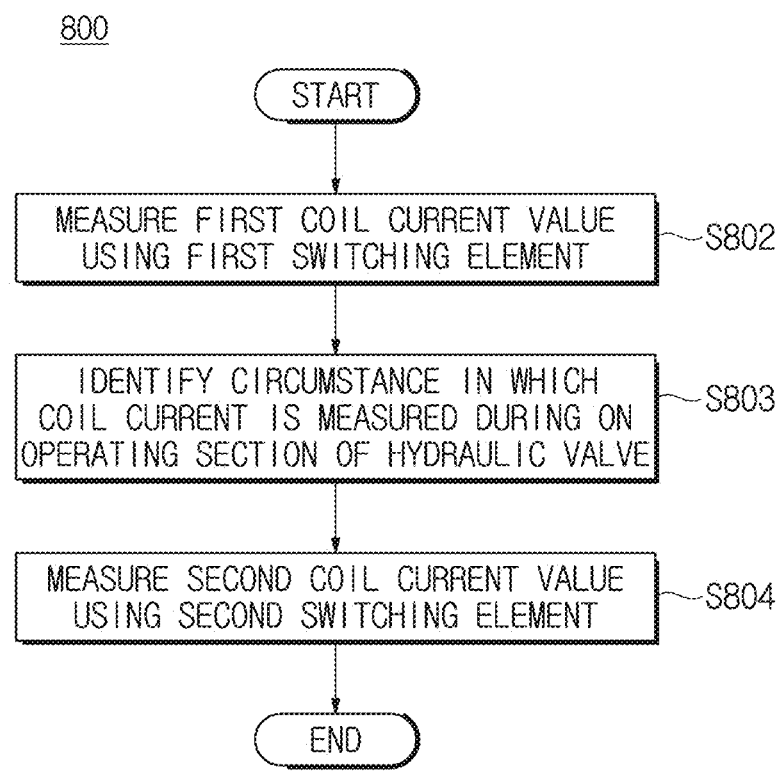
FIG. 8 is a flowchart showing an example of a method of measuring a coil current using the apparatus for measuring the coil current of the hydraulic valve according to the second embodiment of the present invention.
Figure 9:
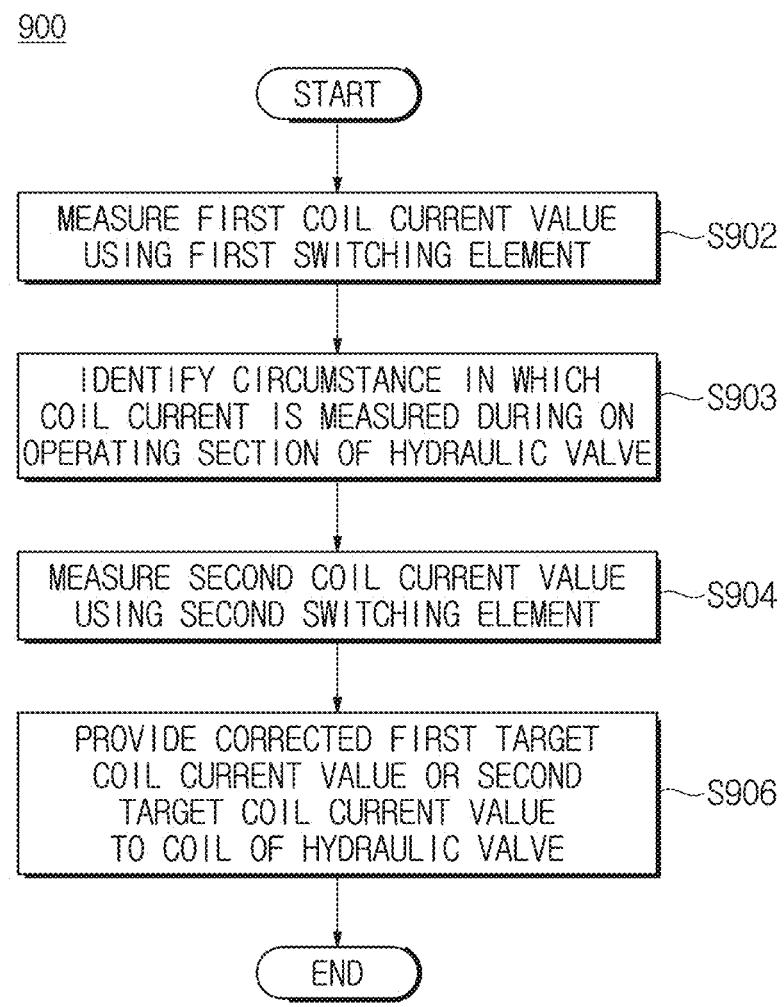
FIG. 9 is a flowchart showing another example of a method of measuring a coil current using the apparatus for measuring the coil current of the hydraulic valve according to the second embodiment of the present invention.

FIG. 8 is a flowchart showing an example of the coil current measurement method using the apparatus for measuring the coil current of the hydraulic valve according to the second embodiment of the present invention, and FIG. 9 is a flowchart showing another example of the coil current measurement method using the apparatus for measuring the coil current of the hydraulic valve according to the second embodiment of the present invention.

As shown in FIGS. 8 and 9, coil current measurement methods 800 and 900 using the apparatus 600 for measuring the coil current of the hydraulic valve 10 according to the second embodiment of the present invention include first coil current measurement steps S802 and S902, second coil current measurement steps S804 and S904, and a coil current correction step S906, like the coil current measurement methods 400 and 500 (see FIGS. 5 and 5) using the apparatus 100 (see FIGS. 2 and 3) for measuring the coil current of the hydraulic valve 10 (FIGS. 2 and 3) according to the first embodiment.

Since functions of the first coil current measurement steps S802 and S902, the second coil current measurement steps S804 and S904, and the coil current correction step S906 in the coil current measurement methods 800 and 900 using the apparatus 600 for measuring the coil current of the hydraulic valve 10 according to the second embodiment of the present invention and an organic connection relation therebetween are the same as functions of the first coil current measurement steps S402 and S502 (see FIGS. 4 and 5), the second coil current measurement steps S404 and S504 (see FIGS. 4 and 5), and the coil current correction step S506 (see FIG. 5) of the coil current measurement methods 400 and 500 (see FIGS. 4 and 5) using the apparatus 100 (see FIGS. 2 and 3) for measuring the coil current of the hydraulic valve 10 (see FIGS. 2 and 3) according to the first embodiment, additional description thereof will be omitted.

Here, the coil current measurement methods 800 and 900 using the apparatus 600 for measuring the coil current of the hydraulic valve 10 according to the second embodiment of the present invention further include first identification steps S803 and S903.

For example, the first identification steps S803 and S903 may be performed after the first coil current measurement steps S802 and S902 and before the second coil current measurement steps S804 and S904.

Here, in the first identification steps S803 and S903, a circumstance in which the coil current flowing through the coil 10a (see FIGS. 6 and 7) of the hydraulic valve 10 (see FIGS. 6 and 7) during the ON operating section of the hydraulic valve 10 (see FIGS. 6 and 7) when the first coil current value is measured by the first coil current measurement unit 602 (see FIGS. 6 and 7) is identified by the first identification unit 603 (see FIGS. 6 and 7).

In this way, the apparatus 600 for measuring the coil current of the hydraulic valve 10 and the coil current measurement methods 800 and 900 according to the second embodiment include the first coil current measurement unit 602, the first identification unit 603 and the second coil current measurement unit 604, and perform the first coil current measurement steps S802 and S902, the first identification steps S803 and S903, the second coil current measurement steps S804 and S904, and the coil current correction step S906.

Accordingly, since the apparatus 600 for measuring the coil current of the hydraulic valve 10 and the coil current measurement methods 800 and 900 according to the second embodiment of the present invention can measure the coil current in consideration of cost of parts consumed to measure the coil current upon measurement of the coil current, the coil current can be efficiently measured while suppressing an increase in cost of parts.

In addition, in the apparatus 600 for measuring the coil current of the hydraulic valve 10 and the coil current measurement methods 800 and 900 according to the second embodiment of the present invention, since the corrected first target coil current value or the corrected second target coil current value can be provided to the coil 10a of the hydraulic valve 10, the coil current of the hydraulic valve 10 can be precisely controlled.

Moreover, in the apparatus 600 for measuring the coil current of the hydraulic valve 10 and the coil current measurement methods 800 and 900 according to the second embodiment of the present invention, since the circumstance in which the coil current flowing through the coil 10a of the hydraulic valve 10 during the ON operating section of the hydraulic valve 10 upon measurement of the first coil current value is measured can be identified, an operator can recognize the measurement circumstance of the coil current to improve convenience of the operation.

Figure 10:
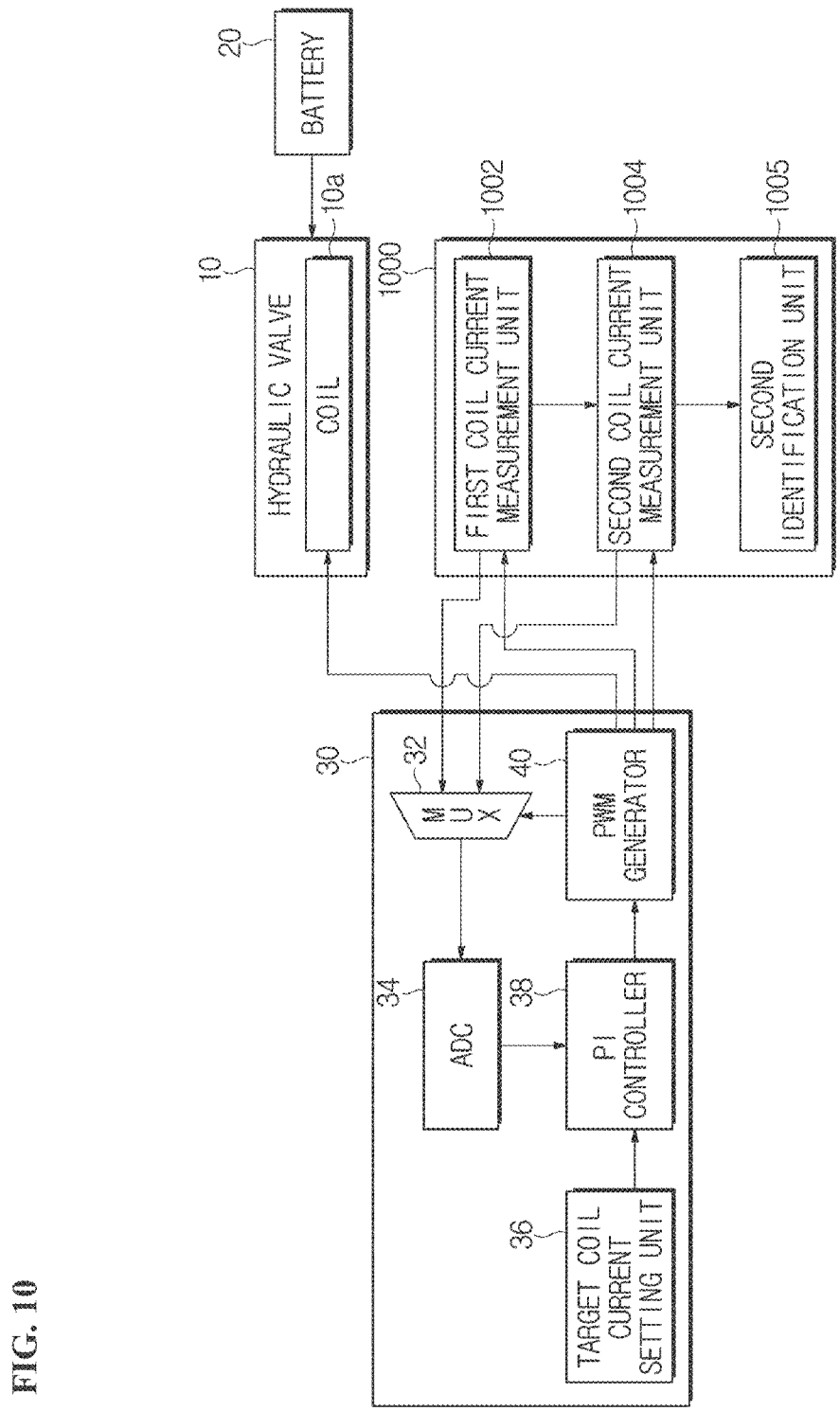
FIG. 10 is a block diagram showing an example of an apparatus for measuring a coil current of a hydraulic valve and a coil current control device according to a third embodiment of the present invention.
Figure 11:
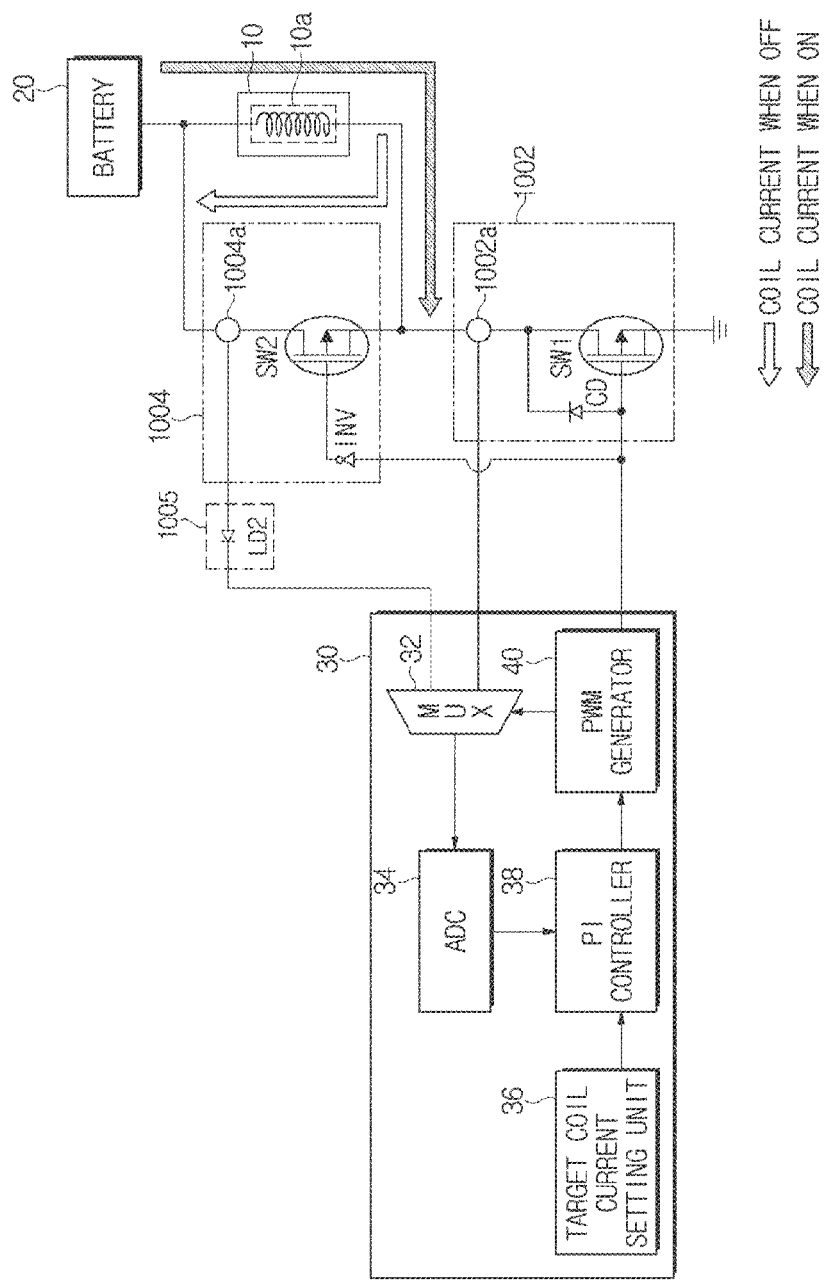
FIG. 11 is a circuit diagram showing an example of the hydraulic valve, the coil current measurement apparatus and the coil current control device shown in FIG. 10.

FIG. 10 is a block diagram showing an example of an apparatus for measuring a coil current of a hydraulic valve and a coil current control device according to a third embodiment of the present invention, and FIG. 11 is a circuit diagram showing the hydraulic valve, the coil current measurement apparatus, and the coil current control device shown in FIG. 10.

Referring to FIGS. 10 and 11, an apparatus 1000 for measuring a coil current of a hydraulic valve 10 according to the third embodiment of the present invention includes a first coil current measurement unit 1002 and a second coil current measurement unit 1004, like the apparatus 100 (see FIGS. 2 and 3) for measuring the coil current of the hydraulic valve 10 (see FIGS. 2 and 3) according to the first embodiment.

Here, since functions of the first coil current measurement unit 1002 and the second coil current measurement unit 1004 corresponding to the apparatus 1000 for measuring the coil current of the hydraulic valve 10 according to the third embodiment of the present invention and an organic connection relation therebetween are the same as functions of the first coil current measurement unit 102 (see FIGS. 2 and 3) and the second coil current measurement unit 104 (see FIGS. 2 and 3) corresponding to the apparatus 100 (see FIGS. 2 and 3) for measuring the coil current of the hydraulic valve 10 (see FIGS. 2 and 3) according to the first embodiment, additional description thereof will be omitted.

Here, the apparatus 1000 for measuring the coil current of the hydraulic valve 10 according to the third embodiment of the present invention further includes a second identification unit 1005.

That is, the second identification unit 1005 identifies a circumstance in which the coil current flowing through the coil 10a of the hydraulic valve 10 is measured using the OFF operating section of the hydraulic valve 10 when the second coil current value is measured by the second coil current measurement unit 1004.

For example, the second identification unit 1005 can identify the circumstance in which the coil current flowing through the coil 10a of the hydraulic valve 10 is measured during the off operating section of the hydraulic valve 10 when the second coil current value is measured by the second coil current measurement unit 1004 through a second light emitting diode LD2.

Here, the second light emitting diode LD2 may be electrically connected to the second coil current measurement unit 1004 and the coil current control device 30 to identify the measurement circumstance of the coil current using the light emission operation.

For example, the second light emitting diode LD2 may be electrically connected to a second coil current feedback unit 1004a of the second coil current measurement unit 1004 and the second end of the MUX 32 of the coil current control device 30 to identify the measurement circumstance of the coil current using the light emission operation.

Hereinafter, the method of measuring the coil current of the hydraulic valve 10 using the apparatus 1000 for measuring the coil current of the hydraulic valve 10 according to the third embodiment of the present invention will be described with reference to FIGS. 12 and 13.

Figure 12:
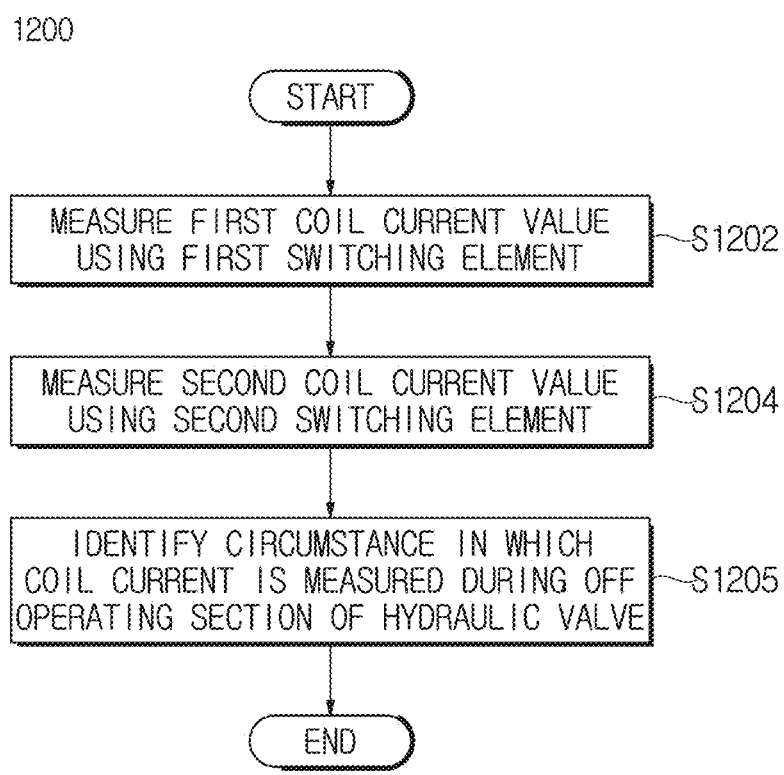
FIG. 12 is a flowchart showing an example of a method of measuring a coil current using the apparatus for measuring the coil current of the hydraulic valve according to a third embodiment of the present invention.
Figure 13:
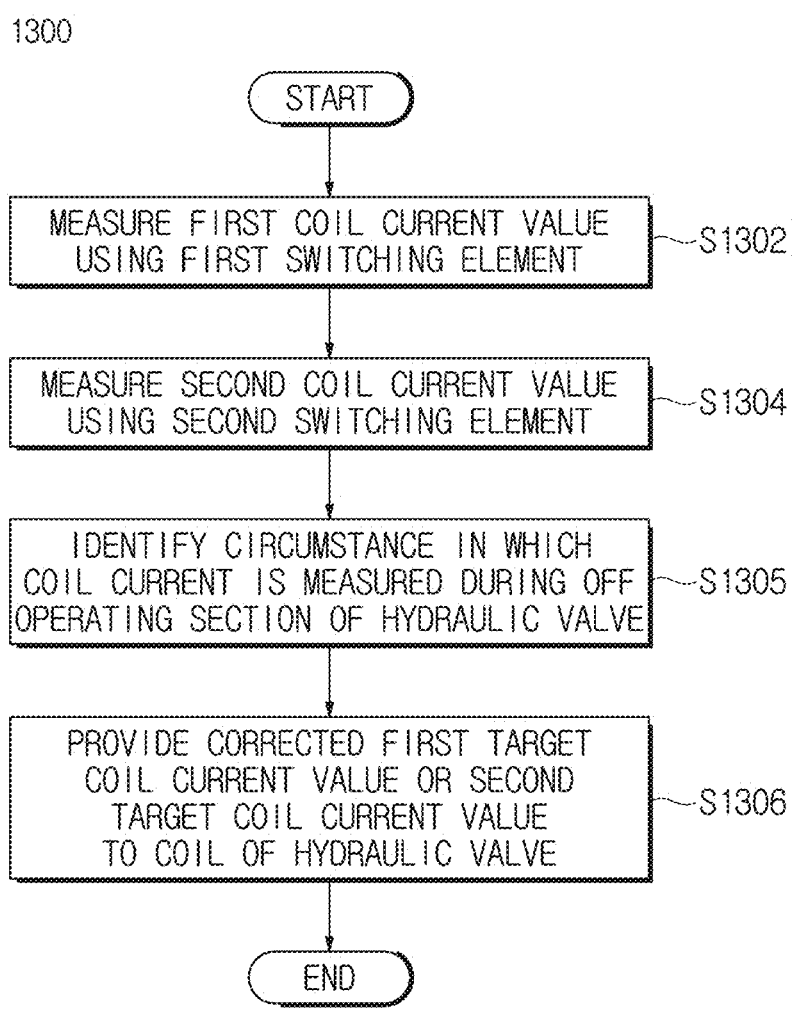
FIG. 13 is a flowchart showing another example of a method of measuring a coil current using the apparatus for measuring the coil current of the hydraulic valve according to the third embodiment of the present invention.

FIG. 12 is a flowchart showing an example of the coil current measurement method using the apparatus for measuring the coil current of the hydraulic valve according to the third embodiment of the present invention, and FIG. 13 is a flowchart showing another example of the coil current measurement method using the apparatus for measuring the coil current of the hydraulic valve according to the third embodiment of the present invention.

As shown in FIGS. 12 and 13, coil current measurement methods 1200 and 1300 using the apparatus 1000 for measuring the coil current of the hydraulic valve 10 according to the third embodiment of the present invention include first coil current measurement steps S1202 and S1302, second coil current measurement steps S1204 and S1304, and a coil current correction step S1306, like the coil current measurement methods 400 and 500 (see FIGS. 4 and 5) using the apparatus 100 (see FIGS. 2 and 3) for measuring the coil current of the hydraulic valve 10 (see FIGS. 2 and 3) according to the first embodiment.

Here, since functions of the first coil current measurement steps S1202 and S1302, the second coil current measurement steps S1204 and S1304, and the coil current correction step S1306 in the coil current measurement methods 1200 and 1300 using the apparatus 1000 for measuring the coil current of the hydraulic valve 10 according to the third embodiment of the present invention and an organic connection relation are the same as the functions of the first coil current measurement steps S402 and S502 (see FIGS. 4 and 5), the second coil current measurement steps S404 and S504 (see FIGS. 4 and 5), and the coil current correction step S506 (see FIG. 5) of the coil current measurement methods 400 and 500 (see FIGS. 4 and 5) using the apparatus 100 (see FIGS. 2 and 3) for measuring the coil current of the hydraulic valve 10 (see FIGS. 2 and 3) according to the first embodiment and an organic connection relation, additional description thereof will be omitted.

Here, the coil current measurement methods 1200 and 1300 using the apparatus 1000 for measuring the coil current of the hydraulic valve 10 according to the third embodiment of the present invention further include second identification steps S1205 and S1305.

For example, the second identification steps S1205 and S1305 may be performed after the second coil current measurement steps S1204 and S1304 and before the coil current correction step S1306.

In the second identification steps S1205 and S1305, a circumstance in which the coil current flowing through the coil 10a (see FIGS. 10 and 11) of the hydraulic valve 10 (see FIGS. 10 and 11) during the OFF operating section of the hydraulic valve 10 (see FIGS. 10 and 11) when the second coil current value is measured by the second coil current measurement unit 1004 (see FIGS. 10 and 11) is identified by the second identification unit 1005 (see FIGS. 10 and 11).

In this way, the apparatus 1000 for measuring the coil current of the hydraulic valve 10 and the coil current measurement methods 1200 and 1300 according to the third embodiment of the present invention include the first coil current measurement unit 1002, the second coil current measurement unit 1004, and the second identification unit 1005 to perform the first coil current measurement steps S1202 and S1302, the second coil current measurement steps S1204 and S1304, the second identification steps S1205 and S1305, and the coil current correction step S1306.

Accordingly, in the apparatus 1000 for measuring the coil current of the hydraulic valve 10 and the coil current measurement methods 1200 and 1300 according to the third embodiment of the present invention, since the coil current can be measured in consideration of cost of parts consumed to measure the coil current upon measurement of the coil current, the coil current can be efficiently measured while suppressing an increase in cost of parts.

In addition, in the apparatus 1000 for measuring the coil current of the hydraulic valve 10 and the coil current measurement methods 1200 and 1300 according to the third embodiment of the present invention, since the corrected first target coil current value or the corrected second target coil current value can be provided to the coil 10a of the hydraulic valve 10, the coil current of the hydraulic valve 10 can be precisely controlled.

Moreover, in the apparatus 1000 for measuring the coil current of the hydraulic valve 10 and the coil current measurement methods 1200 and 1300 according to the third embodiment of the present invention, since the circumstance in which the coil current flowing through the coil 10a of the hydraulic valve 10 during the OFF operating section of the hydraulic valve 10 upon measurement of the second coil current value can be identified, the operator can recognize the measurement circumstance of the coil current to improve convenience of the operation.

As is apparent from the above description, the apparatus for measuring the coil current of the hydraulic valve and the coil current measurement method according to the embodiment of the present invention can efficiently measure the coil current while suppressing an increase in cost of parts.

In addition, the apparatus for measuring the coil current of the hydraulic valve and the coil current measurement method according to the embodiment of the present invention can precisely control the coil current of the hydraulic valve.

In addition, the apparatus for measuring the coil current of the hydraulic valve and the coil current measurement method according to the embodiment of the present invention can improve convenience of the operation because the operator can recognize the measurement circumstance of the coil current.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An apparatus for measuring a coil current of a hydraulic valve, the apparatus comprising:
   a first coil current measurement unit configured to measure a first coil current value flowing through a coil of the hydraulic valve using a first switching element to be switched ON by receiving a first coil current control signal from a coil current control device during an ON operating section of the hydraulic valve in operating sections of the hydraulic valve operated by receiving power of a battery; and
   a second coil current measurement unit configured to receive a second coil current control signal from the coil current control device during an OFF operating section of the hydraulic valve in the operating sections of the hydraulic valve operated by receiving power of the battery, and measure a second coil current value flowing through the coil of the hydraulic valve using a second switching element to be switched ON,
   wherein:
   the coil current control device comprises a multiplexer (MUX) configured to receive an analog signal of the measured first coil current value from the first coil current measurement unit or the measured second coil current value from the second coil current measurement unit, and
   the first coil current measurement unit comprises:
      the first switching element connected to the coil current control device, the coil and the second coil current measurement unit, grounded, and configured to receive the first coil current control signal to be switched ON; and
      a first coil current feedback unit connected to an input of the MUX of the coil current control device, the first switching element, the coil and the second coil current measurement unit to provide the measured first coil current value to the MUX of the coil current control device.

2. The apparatus for measuring the coil current of the hydraulic valve according to claim 1, wherein the first coil current measurement unit further comprises:
   a clamp diode electrically connected to the coil current control device, the first switching element and the first coil current feedback unit.

3. The apparatus for measuring the coil current of the hydraulic valve according to claim 1, wherein the second coil current measurement unit comprises:
   the second switching element electrically connected to the coil current control device, the battery and the coil and configured to receive the second coil control signal to be switched ON; and
   a second coil current feedback unit electrically connected to the coil current control device, the second switching element, the battery and the coil.

4. The apparatus for measuring the coil current of the hydraulic valve according to claim 3, wherein the second coil current measurement unit further comprises:
   an inverter electrically connected to the coil current control device and the second switching element.

5. The apparatus for measuring the coil current of the hydraulic valve according to claim 1, wherein the coil current control device corrects the measured first coil current value or the measured second coil current value to match a preset first target coil current value or a preset second target coil current value, and provides the corrected first target coil current value or the corrected second target coil current value to the coil of the hydraulic valve.

6. The apparatus for measuring the coil current of the hydraulic valve according to claim 1, wherein the coil current control device further comprises:
   an analog digital converter (ADC) configured to convert the first coil current value or the second coil current value of the received analog signal into a digital signal;
   a target coil current setting unit configured to set a digital signal of the first target coil current value or the second target coil current value;
   a proportional integral (PII) controller configured to receive the first coil current value or the second coil current value converted into the digital signal, and the first target coil current value or the second target coil current value of the digital signal, and calculate a first target coil current value or a second target coil current value of a digital signal to be corrected; and a pulse width modulation (PWM) generator configured to provide the first coil current control signal to the first coil current measurement unit or provide the second coil current control signal to the second coil current measurement unit, and generate a target coil current pulse corresponding to the first target coil current value or the second target coil current value of the corrected digital signal to correct the coil current flowing through the coil of the hydraulic valve to provide the target coil current pulse to the coil of the hydraulic valve.

7. The apparatus for measuring the coil current of the hydraulic valve according to claim 1, further comprising a first identification unit configured to identify a circumstance in which the coil current flowing through the coil of the hydraulic valve during an ON operating section of the hydraulic valve is measured when the first coil current value is measured.

8. The apparatus for measuring the coil current of the hydraulic valve according to claim 1, further comprising a second identification unit configured to identify a circumstance in which the coil current flowing through the coil of the hydraulic valve during an OFF operating section of the hydraulic valve is measured when the second coil current value is measured.

9. The apparatus for measuring the coil current of the hydraulic valve according to claim 1, further comprising a clamp diode, wherein one end of the clamp diode is connected to the coil current control device and one end of the first switching element, and another end of the clamp diode is connected to another end of the first switching element.

10. The apparatus for measuring the coil current of the hydraulic valve according to claim 1, further comprising an inverter, wherein one end of the inverter is connected to the coil current control device and the first switching element, and another end of the inverter is connected to the second switching element.

11. The apparatus for measuring the coil current of the hydraulic valve according to claim 1, wherein the second coil current measurement unit comprises:

the second switching element connected to the coil current control device, the battery and the coil and configured to receive the second coil control signal to be switched ON; and a second coil current feedback unit connected to another input of the MUX of the coil current control device, the second switching element, the battery and the coil to provide the measured second coil current value to the MUX of the coil current control device.

12. A method of measuring a coil current of a hydraulic valve, the method comprising:

receiving a first coil current control signal from a coil current control device during an ON operating section of the hydraulic valve in operating sections of the hydraulic valve operated by receiving power of a battery, and measuring a first coil current value flowing through a coil of the hydraulic valve using a first switching element to be switched ON;

receiving a second coil current control signal from the coil current control device during an OFF operating section of the hydraulic valve in the operating sections of the hydraulic valve operated by receiving power of the battery, and measuring a second coil current value flowing through the coil of the hydraulic valve using a second switching element to be switched ON; and providing the measured first coil current value to a first coil current feedback unit connected to an input of a multiplexer (MUX) of the coil current control device, the MUX configured to receive an analog signal of the measured first coil current value or the measured second coil current value.

13. The method of measuring the coil current of the hydraulic valve according to claim 12, further comprising:

correcting the measured first coil current value or the measured second coil current value to match a preset first target coil current value or a preset second target coil current value, and providing the corrected first target coil current value or the corrected second target coil current value to the coil of the hydraulic valve.

14. The method of measuring the coil current of the hydraulic valve according to claim 12, further comprising:

identifying a circumstance in which the coil current flowing through the coil of the hydraulic valve during the ON operating section of the hydraulic valve is measured when the first coil current value is measured.

15. The method of measuring the coil current of the hydraulic valve according to claim 12, further comprising:

identifying a circumstance in which the coil current flowing through the coil of the hydraulic valve during the OFF operating section of the hydraulic valve is measured when the second coil current value is measured.

16. The method of measuring the coil current of the hydraulic valve of claim 12, further comprising providing the measured second coil current value to the MUX of the coil current control device.

* * * * *